United States Patent [19]

Kyu

[11] 4,193,037
[45] Mar. 11, 1980

[54] FREQUENCY DIVIDER CIRCUIT WITH SELECTABLE INTEGER/NON-INTEGER DIVISION

[75] Inventor: Shikun Kyu, Austin, Tex.

[73] Assignee: Motorola, Inc., Schaumburg, Ill.

[21] Appl. No.: 888,441

[22] Filed: Mar. 20, 1978

[51] Int. Cl.$^2$ .............................. H03K 21/36
[52] U.S. Cl. ...................... 328/46; 328/42; 328/48; 307/224 C; 307/225 C
[58] Field of Search ............. 328/46, 48, 42; 307/224 C, 225 C

[56] References Cited

U.S. PATENT DOCUMENTS

| | | | |
|---|---|---|---|
| 3,456,200 | 7/1969 | Bos | 328/48 |
| 3,614,631 | 10/1971 | Bevier | 328/48 |
| 3,644,834 | 2/1972 | Taylor et al. | 328/46 |
| 3,930,169 | 12/1975 | Kuhn | 307/225 C |
| 3,967,205 | 6/1976 | Rossi et al. | 328/46 |
| 4,031,476 | 6/1977 | Goldberg | 328/48 X |
| 4,041,403 | 8/1977 | Chiapparoli | 328/46 X |

*Primary Examiner*—John S. Heyman
*Attorney, Agent, or Firm*—Walter W. Nielsen

[57] ABSTRACT

A divide circuit is provided for dividing an input signal of frequency N by the quantity M+0.5, where N is any positive number and M is an integer. In one embodiment a clock signal operating at a frequency of 3.5 megahertz is divided by 3.5, yielding an output signal of 1 megahertz. Additional logic means may be provided responsive to a control signal for dividing the input signal by the quantity M+1 for a given state of the control signal.

13 Claims, 3 Drawing Figures

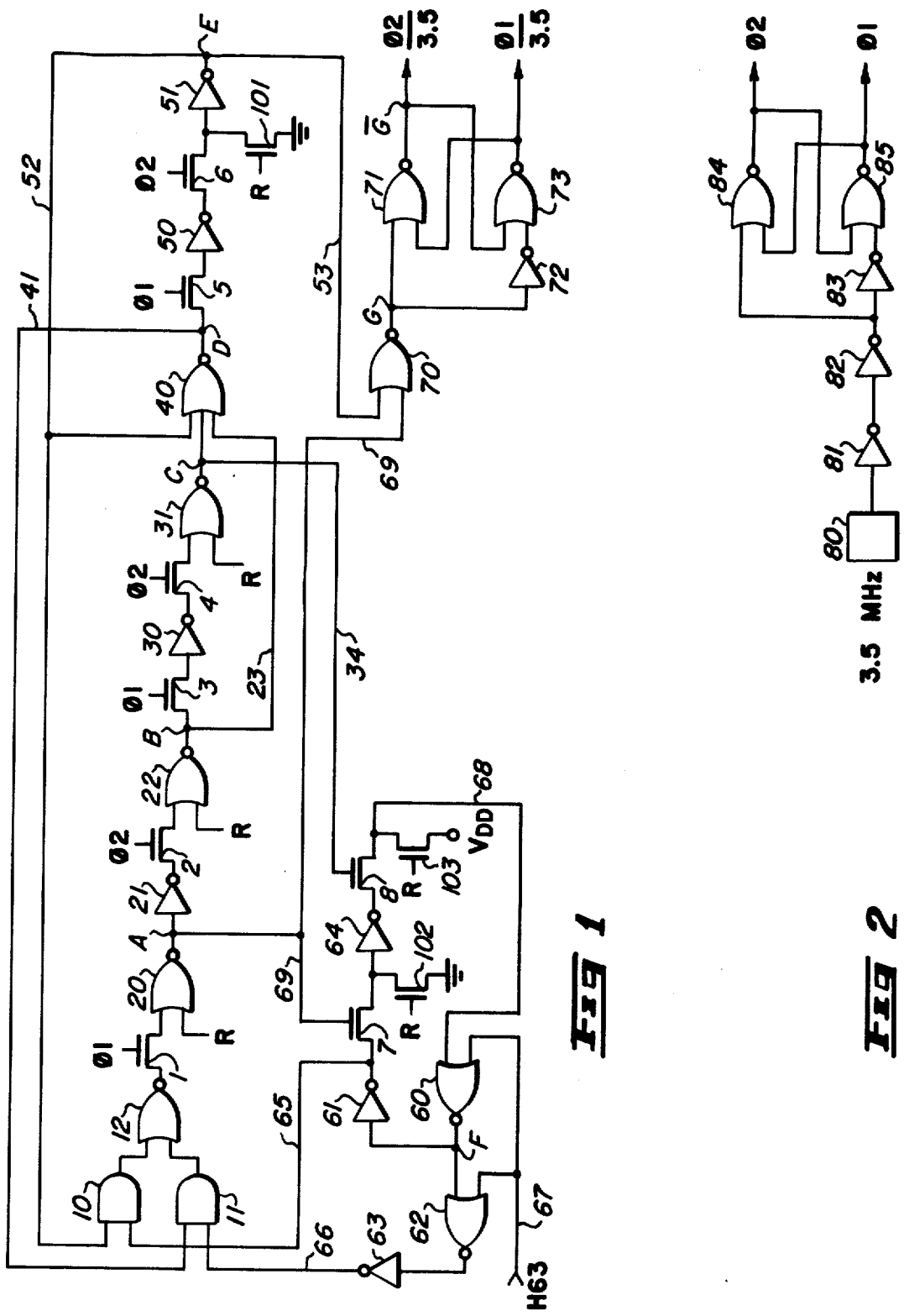

FREQUENCY DIVIDER CIRCUIT WITH SELECTABLE INTEGER/NON-INTEGER DIVISION

BACKGROUND OF THE INVENTION

This invention relates generally to digital logic circuitry, and, in particular, to a divide circuit for dividing an input signal of given frequency by a non-integer quantity.

In the field of television displays, video games, home computing systems and related arts, it is often necessary to generate a clock frequency which is a submultiple of a commonly availble television internal clock frequency of approximately 3.5 megahertz. The present invention has utility, for example, in the video display or video game environment in which a television display means is used in conjunction with a microcomputer and such additional circuits as a video display generator, video encoder, and the like, which have internal operating frequencies of approximately one megahertz. The present invention also has utility in other types of digital circuits employed in the processing of data in binary form, as will be apparent to one skilled in the art.

A known prior art divide circuit suitable for dividing a clock of 3.5 megahertz by the quantity 3.5 utilizes a 7 megahertz clock, representing half cycles of the 3.5 megahertz clock. Such circuit is expensive to manufacture since all of its components must be capable of 7 megahertz operation. Moreover, such circuit is susceptible to noise spikes which may be misinterpreted as the 7 megahertz clock pulses. There is thus a need for a relatively inexpensive divide circuit for dividing an input signal of given frequency by a non-integer divisor, which circuit utilizes an internal clock of frequency no greater than that of such imput signal.

SUMMARY OF THE INVENTION

Accordingly, it is an object of the present invention to provide a relatively inexpensive divide circuit in which the divisor is a non-integer number.

It is also an object of the present invention to provide a divide circuit which divides an input signal of frequency N by the quantity M+0.5, M being an integer, and which operates on an internal clock of frequency N.

It is a further object of the present invention to provide a divide circuit which alternately divides an input signal of frequency N by the quantity (M+0.5) or (M+1), depending upon the informational content of a control signal to which the divide circuit is responsive.

These and other objects are achieved in accordance with a preferred embodiment of the invention by providing a divide circuit comprising a clock source providing first and second clock signals each of frequency N, the first and second clock signals being non-overlapping, first logic means responsive to a given transition in the first clock signal for generating a first output having a duration not exceeding three cycles of the first clock signal, second logic means responsive to the first and second clock signals for generating a second output M+0.5 cycles of the first clock after the first output is generated and having a duration of exceeding three cycles of the first clock signal, M being a positive integer, and third logic means responsive to the presence of either the first or second outputs for generating a third output, the third output having a frequency equal to N/(M+0.5). A fourth logic means may be provided which is responsive to a control signal having first and second states, whereby the divide circuit generates a third output at frequency N/(M+0.5) when the control signal is in the first state and generates the third output signal at frequency N/(M+1) when the control signal is in the second state.

BRIEF DESCRIPTION OF THE DRAWINGS

The invention is pointed out with particularity in the appended claims. However, other features of the invention will become more apparent and the invention will be best understood by referring to the following detailed description in conjunction with the accompanying drawings in which:

FIG. 1 shows a detailed logic diagram illustrating a preferred embodiment of the divide circuit of the present invention.

FIG. 2 shows a detailed logic diagram illustrating the generation of the clock signals of the present invention.

DETAILED DESCRIPTION OF THE INVENTION

Figure 3:
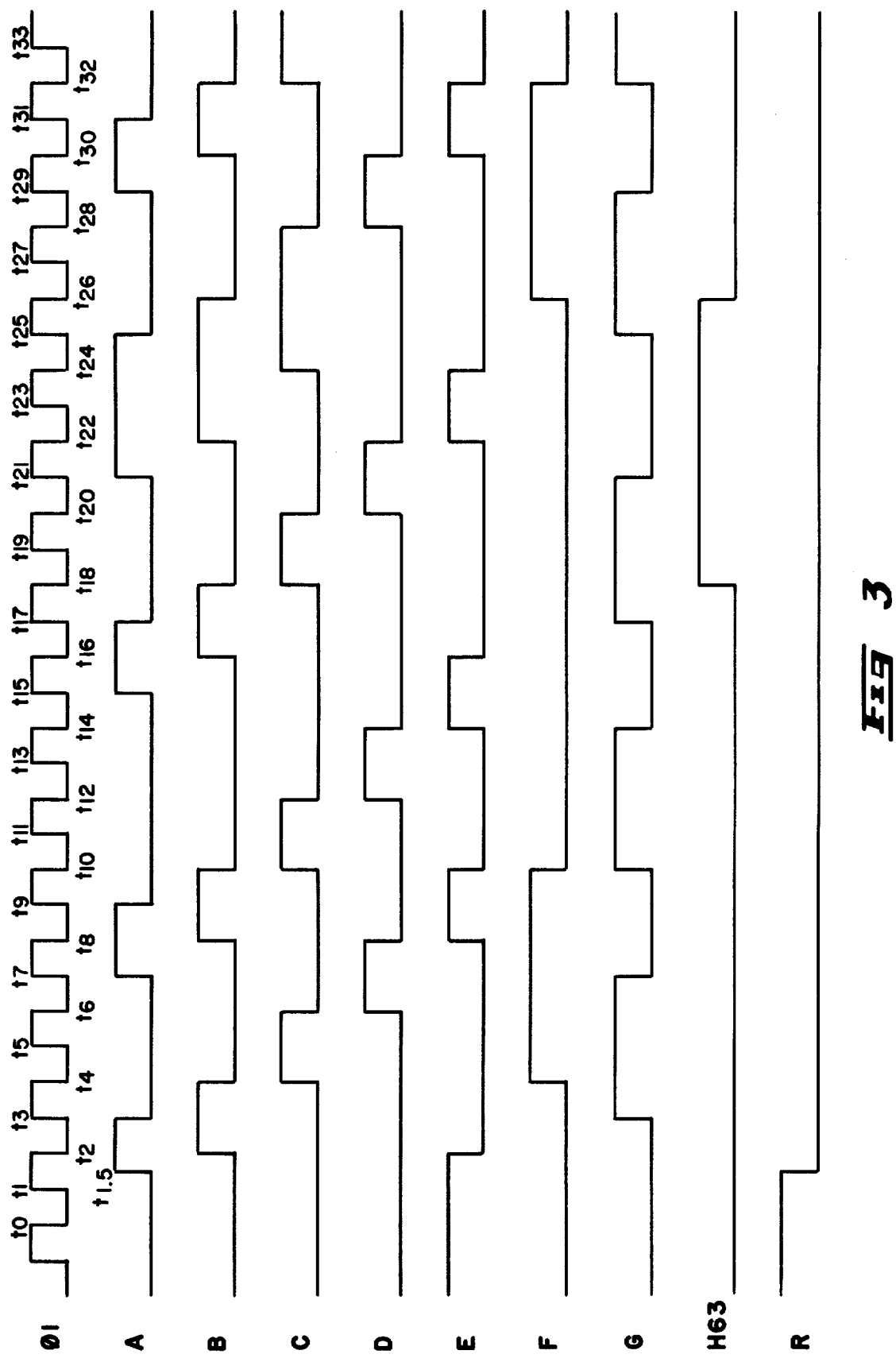
FIG. 3 shows a timing diagram illustrating the operation of the divide circuit of the present invention in two different modes of operation.

Referring now to FIG. 1, a detailed logic diagram of a preferred embodiment of the divide circuit is shown. AND gates 10 and 11, together with NOR gate 12, constitute an AND-OR-INVERTER. Transmission gates 1 and 2 and NOR gates 20 and 22 comprise a first flip-flop for temporarily storing information. Transmission gate 1 is rendered conductive when a first clock signal $\phi 1$ is on, and for this condition transmission gate 1 transmits the output of NOR gate 12 to the upper input to NOR gate 20. The lower input to NOR gate 20 is responsive to a reset signal R. The output of NOR gate 20 is identified as signal A, which signal is inverted by inverter 21. Transmission gate 2 is rendered conductive when clock signal $\phi 2$ is high, causing the output of inverter 21 to be applied to the upper input to NOR gate 22. The lower input to NOR gate 22 is responsive to reset signal R. The output of NOR gate 22 is indicated in FIG. 1 as signal B.

Transmission gates 3 and 4, inverter 30, and NOR gate 31 constitute a second flip-flop. Transmission gates 3 and 4 are responsive to clock signals $\phi 1$ and $\phi 2$ respectively. When transmission gate 3 is conductive, the output of NOR gate 22 is applied to inverter 30, and when transmission gate 4 is conductive, the output of inverter 30 is applied to the upper input to NOR gate 31. The lower input to NOR gate 31 is responsive to reset signal R. The output of NOR gate 31 is indicated in FIG. 1 as signal C.

NOR gate 40 has three inputs. The upper input to NOR gate 40 is received over line 52 as signal E, representing the output of a third flip-flop yet to be described. The middle input to NOR gate 40 is responsive to signal C, representing the output of NOR gate 31. The lower input to NOR gate 40 is responsive to signal B over line 23, representing the output of the first flip-flop. The output of NOR gate 40 is indicated in FIG. 1 as signal D.

Transmission gates 5 and 6, switch 101, and inverters 50 and 51 constitute a third flip-flop. Transmission gate 5 is rendered conductive when clock signal $\phi 1$ is high, allowing signal D to be applied to inverter 50. The output of inverter 50 is transmitted to the input of inverter 51 when transmission gate 6 is rendered conductive by clock pulse $\phi 2$ going high, provided that reset signal R is low, preventing a conductive path to ground through switch 101. The output of inverter 51 is indicated in FIG. 1 as signal E.

Inverters 61 and 64, transmission gates 7 and 8, and switches 102 and 103 constitute a fourth flip-flop. Transmission gate 7 is rendered conductive when signal A over line 69 is high, allowing the output of inverter 61 to be applied to inverter 64, assuming that reset signal R is low so that a conductive path to ground through switch 102 is not provided. Transmission gate 8 is rendered conductive when signal C over line 34 is high, permitting the output of inverter 64 to be applied over line 68 through the upper input of NOR gate 60. When reset signal R is high, switch 103 is rendered conductive, permitting $V_{DD}$ to be applied to the upper input of NOR gate 60 over line 68. The output of NOR gate 60 is indicated as signal F in FIG. 1, and it is applied to inverter 61.

NOR gates 60 and 62 constitute control circuitry responsive to a control signal H63 which may be transmitted over line 67 to the lower inputs of NOR gates 60 and 62. The upper input to NOR gate 62 is responsive to signal F. The output of NOR gate 62 is inverted by inverter 63 and transmitted over line 66 to the lower input of AND gate 11. Signal F is inverted by inverter 61 and transmitted over line 65 to the lower input of AND gate 10. The upper input of AND gate 11 is responsive to signal D transmitted over line 41, and the upper input of AND gate 10 is responsive to signal E via line 52.

NOR gate 70 receives at its upper input signal E transmitted over line 53 and at its lower input signal A transmitted over line 69. The output of NOR gate 70 is applied to cross-coupled NOR gate 71 and 73, the output G of NOR gate 70 being applied to the upper input of NOR gate 71 and to inverter 72. The output of inverter 72 is applied to the lower input of NOR gate 73. The output $\overline{G}$ of NOR gate 71 is applied to the upper input of NOR gate 73, whose output, which is identical to G, is applied to the lower input of NOR gate 71.

FIG. 2 illustrates a detailed logic diagram of a circuit for generating clock signals $\phi 1$ and $\phi 2$. In a preferred embodiment, a crystal oscillator 80 generates an output of approximately 3.5 megahertz, which is twice inverted by inverters 81 and 82. The output of inverter 82 is applied as the upper level input to NOR gate 84 and to inverter 83, whose output is applied to the lower input of NOR gate 85. The output of NOR gate 85 is indicated as clock signal $\phi 1$, which signal is also applied to the lower input of NOR gate 84. The output of NOR gate 84 is indicated as clock signal $\phi 2$, which is also applied to the upper input of NOR gate 85. It should be understood that clock signals $\phi 1$ and $\phi 2$ need not necessarily be limited to 3.5 megahertz and that the divide circuit of the present invention will operate over a wide range of clock frequencies. A clock frequency of approximately 3.5 megahertz was selected in the preferred embodiment, since such embodiment was designed for utilization in circuitry associated with a television receiver, wherein a clock of approximately 3.5 megahertz is typically provided. The divided circuit illustrated in FIG. 1 generates an output signal G having a frequency equal to that of the $\phi 1$ clock signal divided by 3.5 and an output signal G having a frequency equal to that of the $\phi 2$ clock signal divided by 3.5 in a manner to be described below in conjunction with the timing diagram shown in FIG. 3.

The preferred embodiment of the divide circuit of the present invention was implemented using NMOS semiconductor circuit technology, and it will be appreciated by those skilled in the art that each of the various transmission gates shown in FIG. 1, when turned off, will temporarily store, on a dynamic basis, the signal level such gate was transmitting when it was on. Thus each transmission gate serves as a temporary storage element for a period of at least several milliseconds, which is of ample time duration compared to the operational frequency of 3.5 megahertz.

The operation of the divide circuit will not be described with regard to FIG. 3, which is the timing diagram illustrating the operation of the circuit. The states of signals $\phi 1$, A–G, H63, and R are shown in FIG. 3 for various times indicated by $t_1$-$t_{33}$.

First a reset operation will be described at time $t_1$. At time $t_1$ reset signal R is high, so that the outputs of NOR gates 20, 22, and 31, represented by signals A, B, and C, respectively, are all low. Switch 101 is rendered conductive, so that the input to inverter 51 is low, and its output, represented by signal E, is high. Signal E being high causes NOR gate 40 to generate a low output signal D. The application of reset signal R to switch 103 causes a high level signal to be transmitted over line 68 to NOR gate 60, which generates signal F low. NOR gate 70 receives as inputs signal A low and signal E high, and accordingly causes signal G to be generated in a low state.

At time $t_{1.5}$, between times $t_1$ and $t_2$, reset signal R is set low. At this time AND gate 10 is generating a high level signal, since signals E and $\overline{F}$ are both high. AND gate 11 is generating a low level signal, since both of its inputs are low. NOR gate 12 accordingly is generating a low level signal through transmission gate 1, which is on at this time, to the upper input of NOR gate 20. With both of its inputs low, NOR gate 20 generates signal A low. Since signal A was previously in a low state at time $t_0$, when transmission gate 2 was conducting, the inverted high level signal from inverter 21 is still being stored by transmission gate 2 and provides a high level input to NOR gate 22. The output B of NOR gate 22 is accordingly low at time $t_{1.5}$. Similarly, since signal B was at a low level just prior to time $t_0$, when transmission gate 3 was conducting, the high level output of inverter 30 is stored by transmission gate 4 at time $t_{1.5}$ and applied as an input to NOR gate 31. Accordingly NOR gate 31 generates output C low at time $t_{1.5}$. Since signal E is high at this time, NOR gate 40 continues to generate signal D low. Although switch 103 is now off, it continues to store a high level signal and transmit same over line 68 to NOR gate 60, so that signal F remains low. Output signal G also remains low since the E input to NOR gate 70 remains high.

At time $t_2$ the signal A output of NOR gate 20 remains high, since both inputs to NOR gate 20 are low. Transmission gate 2 is rendered conductive by the $\phi 2$ clock signal going high, causing the low level output of inverter 21 to be applied to NOR gate 22. NOR gate 22 generates signal B high at this time, since both its inputs are low. Since the input to inverter 30 was low at time $t_{1.5}$, a low signal level is stored by transmission gate 3 at time $t_2$, which low signal level is inverted by inverter 30. The high level output of inverter 30 is conducted to NOR gate 31 by transmission gate 4 which is rendered conductive by the $\phi 2$ clock going high. The high level signal applied to NOR gate 31 maintains its output C low. The application of the high level B signal to NOR gate 40 causes its output D to remain low. Since at time t$_{1.5}$ transmission gate 5 was conducting a low level signal to the input of inverter 50, a low level signal is stored by transmission gate 5 when it is rendered non-conductive by the application of a low level $\phi$1 clock signal. Accordingly the output of inverter 50 is high, which output is applied to the input of inverter 51 through conducting transmission gate 6. Inverter 51 thereby generates signal E low at this time. Because signal C remains low, the high level signal stored by transmisssion gate 8 continues to be applied to NOR gate 60, and signal F therefore remains in its low state. Because signal A is high, NOR gate 70 continues to generate output signal G in its low state at time t,2.

At time t$_3$ the high level output of the AND-OR-INVERTER is transmitted through transmission gate 1 to NOR gate 20, causing signal A to go low. Since at time t$_2$ a low level signal was transmitted through transmission gate 2 to the input of NOR gate 22, when transmission gate 2 is rendered non-conductive at time t$_3$ a low level signal is stored by transmission gate 2 and is applied to the upper input of NOR gate 22. Accordingly signal B remains high at time t$_3$. Since a high level signal is stored by transmission gate 4 at this time, NOR gate 31 continues to generate a low level signal C. NOR gate 21 continues to generate a low level signal D since signal B remains high. Inverter 51 continues to generate a low level signal E, since a high level signal is stored by transmission gate 6 and is applied to inverter 51. Signal F remains low, since a high level signal continues to be stored by transmission gate 8. Output signal G goes high at time t$_3$ when signal A goes low.

At time t,4 signal D goes low since the high level output of inverter 21 is transmitted to NOR gate 22 when transmission gate 2 is rendered conductive. The high level signal being stored by transmission gate 3 at this time is inverted by inverter 30 and is applied as a low level input to NOR gate 31, causing its output signal C to go high. Accordingly signal D remains low. The low level signal stored by transmission gate 5 is inverted by inverter 50 and is applied to inverter 51 through transmission gate 6. Accordingly signal E remains low. Since transmission gate 7 is storing a high level signal at this time due to the fact that a high level signal was transmitted through it at time t$_2$, inverter 64 is generating a low level signal which is transmitted through transmission gate 8 and applied to the upper input of NOR gate 60. Accordingly NOR gate 60 generates signal F high at this time. The high level signal transmitted through transmission gate 1 at the time t$_3$ is stored by such gate at time t$_4$, so signal A remains low. Since both signals A and E are low, output signal G remains high at time t$_4$.

At time t$_5$ transmission gate 2 is storing a high level signal, causing NOR gate 22 to generate signal B low. Transmission gate 4 is storing a low level signal, so that its output signal C remains high. The output D of NOR gate 40 remains low. Since transmission gate 6 is storing a high level signal, the output E of inverter 51 remains low. Likewise, signal F remains high, since transmission gate 8 continues to conduct the low level output of inverter 64 to NOR gate 60. The output of the AND-OR-INVERTER is high, since both of the inputs to OR gate 12 are low. Thus signal A remains low. At time t$_6$ transmission gate 1 stores a high level signal, so that signal A remains low. Signal B is also low, since the high level output of inverter 21 is transmitted via transmission gate 2 to NOR gate 22. Transmission gate 3 is storing a low level signal at this time, so that the high level output of inverter 30 is applied through transmission gate 4 as a high level input to NOR gate 31. The output C of NOR gate 31 therefore goes low. Transmission gate 5 is storing a low level signal at this time which is twice inverted by inverters 50 and 51, so that signal E is low. Since signals B, C, and E are all low, the output D of inverter 50 goes high. Transmission gate 8 is switched off by signal C going low, but it continues to store a low level signal which is applied to NOR gate 60. Thus signal F remains high. Since both signals A and E are low, the output signal G of inverter 70 remains high.

At time t$_7$ transmission gate 2 is storing a high level signal, so that NOR gate 22 continues to generate signal B low. Transmission gate 4 is storing a high level signal, so that the output C or NOR gate 31 remains low. Transmission gate 6 is also storing a high level signal, so that signal E remains low. The output of the AND-OR-INVERTER remains low, which low level signal is transmitted through transmission gate 1 to NOR gate 20. Signal A therefore goes high at this time. Since signals B, C, and E are all low, the output signal D or NOR gate 40 remains high. Transmission gate 8 continues to store a low level signal, and signal F remains high. When signal A goes high, output signal G or NOR gate 70 goes low.

At time t$_8$ transmission gate 1 is storing a low level signal, so signal A remains high. Transmission gate 2 conducts the low level output of inverter 21 to the upper input of NOR gate 22, causing signal B to go high. Transmission gate 3 is storing a low level signal, and the high level output of inverter 30 is transmitted to the upper input of NOR gate 31 through transmission gate 4, so that signal C remains low. Transmission gate 5 is storing a high level signal which is successively inverted by inverters 50 and 51, so that signal E goes high at this time. When signal E goes high, NOR gate 40 generates a low level signal D. Transmission gate 8 continues to store a low level signal, so that signal F remains high. Both the signal A and E inputs to NOR gate 70 are high, and output signal G remains low.

At time t$_9$ transmission gate 2 is storing a low level signal, so that signal B remains high. Transmission gate 4 is storing a high level signal, so that the output C of NOR gate 31 remains low. Since signal B is high, the output D of NOR gate 40 remains low. Transmission gate 6 is storing a low level signal which is inverted by inverter 51, so that signal E remains high. Signal F continues to remain high, since transmission gate 8 continues to store a low level signal. The output of the AND-OR-INVERTER is high, which output is transmitted through transmission gate 1 to the upper level input of NOR gate 20, causing signal A to go low at this time. The output signal G or NOR gate 70 remains low, since signal E is high.

At time t$_{10}$ transmission gate 1 is storing a high level signal, so that signal A remains low. Transmission gate 2 transmits the high level output of inverter 21 to the upper level input of NOR gate 22, so that signal B goes low at this time. Transmission gate 3 is storing a high level signal which is inverted by inverter 30 and transmitted through transmission gate 4 to the upper level input of NOR gate 31, so that signal C goes high at this time. With signal C high, the output D of NOR gate 40 remains low. Transmission gate 5 is storing a low level signal which is twice inverted by inverters 50 and 51, so that signal E is low. Transmission gate 7 is storing a low level signal, which is inverted by inverter 64 and conducted through transmission gate 8 to the upper input of NOR gate 60 causing its output signal F to go low at this time. NOR gate 70 generates output signal G high at this time since signals A and E are both low.

One will note from FIG. 3 that between times $t_3$ and $t_{10}$ clock signal $\phi 1$ undergoes three and a half cycles and output signal G undergoes one cycle. Therefore output signal G represents clock signal $\phi 1$ divided by the quantity 3.5. By observing the operation of the divide circuit between times $t_{10}$ and $t_{17}$ in a similar manner, one will see that another complete cycle of output signal G is generated.

Similarly, one will observe that when control signal H63 is switched from a low state to a high state at time $t_{18}$, the operation of the divide circuit is modified such that the frequency of output signal G represents the quotient of the frequency of clock signal $\phi 1$ divided by the quantity 4. One will observe in particular that the operation of the circuit between times $t_{17}$ and $t_{21}$ is similar to that between times $t_3$ and $t_7$. However, the operation of the divide circuit when control signal H63 is high between times $t_{21}$ and $t_{25}$ is substantially different from that between times $t_7$ and $t_{10}$, in that signals A, B, and C remain high for a longer time during the period between $t_{21}$ and $t_{25}$. When control signal H63 is dropped at time $t_{26}$ the divide circuit resumes the mode of operation depicted prior to time $t_{18}$.

The mode of operation of the divide circuit in which control signal H63 is set high to cause the insertion of a divide-by four cycle in output signal G is useful when operating a television display. For example, in an interlaced mode of operation, control signal H63 may be set high on the 63rd character condition of each 64 character condition line so that each successive line is shifted half a phase with respect to the line immediately preceding it.

It will be apparent to those skilled in the art that the disclosed Divide Circuit may be modified in numerous ways and may assume many embodiments other than the preferred embodiment specifically set out and described above. For example, NOR gates 60 and 62 and control signal line 67 may be dispensed with in the event that the divide-by-four mode of operation is not required. Further, the circuit may be modified to divide by quantities other than 3.5. For example, if it is desired to divide the frequency of the $\phi 1$ clock by the quantity 4.5, an additional flip-flop stage essentially like the second flip-flop, comprising transmission gates 3 and 4, inverter 30, and NOR gate 31, could be inserted between the first and second flip-flops.

Accordingly, it is intended by the appended claims to cover all modifications of the invention which fall within the true spirit and scope of invention.

What is claimed is:

1. A divide circuit comprising:
   an AND-OR-INVERTER comprising first and second AND gates and a first NOR gate responsive to the outputs of said AND gates;
   a first flip-flop responsive to the output of said AND-OR-INVERTER and having first and second transmission gates, said first flip-flop generating outputs A and B;
   a second flip-flop responsive to said output B and having third and fourth transmission gates, said second flip-flop generating an output C;
   a second NOR gate responsive to said output C and generating an output D;
   a third flip-flop responsive to said output D and having fifth and sixth transmission gates, said third flip-flop generating an output E;
   a clock source providing a first clock signal of frequency N to said first, third, and fifth transmission gates, said clock source further providing a second clock signal of frequency N to said second, fourth, and sixth transmission gates, said first and second clock signals being non-overlapping;
   a fourth flip-flop responsive to said outputs A and C and generating an output F and its complement $\overline{F}$;
   means coupling said output E to one input of said first AND gate, coupling said complement $\overline{F}$ to the other input of said first AND gate, coupling said output D to one input of said second AND gate, and coupling said output F to the other input of said second AND gate;
   additional means coupling said outputs B and E to said second NOR gate as additional inputs thereto; and
   a third NOR gate resposive to said outputs A and E and generating an output G having a frequency equal to $N/(M+0.5)$, M being a positive integer.

2. The divide circuit recited in claim 1, wherein M is 3.

3. The divide circuit recited in claim 2, wherein N is approximately 3.5 megahertz.

4. The divide circuit recited in claim 1, wherein said fourth flip-flop is responsive to a control signal having first and second states, said divide circuit generating said output G at frequency $N/(M+0.5)$ when said control signal is in said first state and generating said output G at frequency $N/(M+1)$ when said control signal is in said second state.

5. The divide circuit recited in claim 4, wherein M is 3.

6. The divide circuit recited in claim 5, wherein N is approximately 3.5 megahertz.

7. A divide circuit comprising:
   means responsive to an external clock signal of frequency N for generating an output signal of frequency $N/(M+0.5)$, M being a positive integer; and
   additional means responsive to an external control signal having first and second states, said divide circuit generating said output signal at frequency $N/(M+0.5)$ when said control signal is in said first state and generating said output signal at frequency $N/(M+1)$ when said control signal in said second state.

8. The divide circuit recited in claim 7, wherein M is 3.

9. The divide circuit recited in claim 8, wherein N is approximately 3.5 megahertz.

10. A divide circuit comprising:
    a clock source providing first and second clock signals each of frequency N, said first and second clock signals being non-overlapping;
    first logic means responsive to a given transition in said first clock signal for generating a first output having a duration not exceeding three cycles of said first clock signal;
    second logic means responsive to said first and second clock signals for generating a second output $M+0.5$ cycles of said first clock signal after said first output is generated and having a duration not exceeding three cycles of said first clock signal, M being a positive integer;

third logic means responsive to the presence of either said first or second outputs for generating a third output, said third output having a frequency equal to $N/(M+0.5)$; and fourth logic means responsive to a control signal having first and second states, said divide circuit generating said third output at frequency $N/(M+0.5)$ when said control signal is in said first state and generating said third output signal at frequency $N/(M+1)$ when said control signal is in said second state.

11. The divide circuit recited in claim 10, wherein the duration of each of said first and second outputs is equal to two cycles of said first clock signal.

12. The divide circuit recited in claim 10, wherein M is 3.

13. The divide circuit recited in claim 12, wherein N is approximately 3.5 megahertz.

* * * * *